United States Patent
Ayliffe et al.

(10) Patent No.: US 9,774,172 B1
(45) Date of Patent: Sep. 26, 2017

(54) MULTI-LASER PACKAGE USING SHARED OPTICS

(71) Applicant: Lumentum Operations LLC, Milpitas, CA (US)

(72) Inventors: Michael Ayliffe, Ottawa (CA); Yuliya Akulova, Sunnyvale, CA (US); Claude Gamache, Gatineau (CA)

(73) Assignee: Lumentum Operations LLC, Milpitas, CA (US)

( * ) Notice: Subject to any disclaimer, the term of this patent is extended or adjusted under 35 U.S.C. 154(b) by 0 days.

(21) Appl. No.: 15/337,916

(22) Filed: Oct. 28, 2016

(51) Int. Cl.
| | |
|---|---|
| H01S 5/00 | (2006.01) |
| H01S 5/40 | (2006.01) |
| H01S 5/022 | (2006.01) |
| H01S 5/183 | (2006.01) |
| H01S 5/026 | (2006.01) |

(52) U.S. Cl.
CPC .......... *H01S 5/4075* (2013.01); *H01S 5/0071* (2013.01); *H01S 5/0224* (2013.01); *H01S 5/0267* (2013.01); *H01S 5/02252* (2013.01); *H01S 5/02288* (2013.01); *H01S 5/18388* (2013.01); *H01S 5/4087* (2013.01); *H01S 5/0064* (2013.01); *H01S 5/02248* (2013.01); *H01S 5/4056* (2013.01)

(58) Field of Classification Search
CPC .... H01S 5/4075; H01S 5/4056; H01S 5/0071; H01S 5/4087; H01S 5/18388; H01S 5/0267; H01S 5/02288; H01S 5/02248; H01S 5/02252; H01S 5/0064
See application file for complete search history.

(56) References Cited

U.S. PATENT DOCUMENTS

| | | | | |
|---|---|---|---|---|
| 5,264,392 | A * | 11/1993 | Gaebe ................ | G02B 6/12004 257/E25.032 |
| 5,757,830 | A * | 5/1998 | Liau ..................... | G02B 6/4204 372/108 |
| 2003/0063832 | A1* | 4/2003 | Hellman .............. | G02B 6/2706 385/11 |
| 2005/0123237 | A1* | 6/2005 | Ayliffe ................. | G02B 6/4204 385/33 |
| 2007/0002922 | A1* | 1/2007 | McDonald ............ | G02B 5/126 372/92 |
| 2007/0199927 | A1* | 8/2007 | Gu ........................ | B23K 26/04 219/121.69 |

* cited by examiner

Primary Examiner — Kinam Park
(74) Attorney, Agent, or Firm — Harrity & Harrity, LLP (57) ABSTRACT

An optical device may include a semiconductor laser chip to independently generate four laser beams at different wavelengths. Each laser beam, of the four laser beams, may be directed to a respective optical output of the optical device with a sub-micron level of tolerance of each laser beam relative to the respective optical outputs of the optical device, and each laser beam, of the four laser beams, may be associated with a different optical path from the semiconductor laser chip to the respective optical output of the optical device. The optical device may include a lens to receive each of the four laser beams. The lens may be positioned to direct each laser beam, of the four laser beams, toward the respective optical output of the optical device. The optical device may include an optical isolator to receive each of the four laser beams.

20 Claims, 8 Drawing Sheets

MULTI-LASER PACKAGE USING SHARED OPTICS

TECHNICAL FIELD

The present disclosure relates to laser systems. More particularly, the present disclosure relates to an optical device, including a multi-laser assembly, to spatially align a set of laser beams to a set of output optical ports.

BACKGROUND

Laser emitters provide laser light at specific wavelengths for optical communications transmitters and transceivers. Multiple laser emitters may be required, where the optical communications transmitters and transceivers use multiple wavelengths of light. Increasing the quantity of laser emitters increases the size of an optical device providing the laser emitters for an optical communications transmitter or transceiver. With each laser emitter requiring an alignment step to couple the laser beam to an output coupler, multiple laser emitters require multiple alignment steps, which may increase manufacture time and/or cost. The size of optical communications transmitters and transceivers has been decreasing, or staying the same, while the number of wavelengths of light desired has been increasing. Accordingly, reducing the size of an optical device providing multiple laser emitters would be advantageous. In addition, the ability to align multiple laser beams of an optical device in a single alignment step would be advantageous.

SUMMARY

According to some possible implementations, an optical device may include a semiconductor laser chip to independently generate four laser beams at different wavelengths. Each laser beam, of the four laser beams, may be directed to a respective optical output of the optical device with a sub-micron level of tolerance of each laser beam relative to the respective optical outputs of the optical device. Each laser beam, of the four laser beams, may be associated with a different optical path from the semiconductor laser chip to the respective optical output of the optical device. The optical device may include a lens to receive each of the four laser beams. The lens may be positioned to direct each laser beam, of the four laser beams, toward the respective optical output of the optical device. The optical device may include an optical isolator to receive each of the four laser beams.

According to some possible implementations, an optical device may include a first laser chip and a second laser chip. The first laser chip may include a first laser emitter to generate a first optical beam and a second laser emitter to generate a second optical beam. The second laser chip may include a third laser emitter to generate a third optical beam and a fourth laser emitter to generate a fourth optical beam. Each optical beam, of the first optical beam, the second optical beam, the third optical beam, and the fourth optical beam, may have a different center wavelength. The optical device may include one or more lenses positioned in optical paths of the first optical beam, the second optical beam, the third optical beam, and the fourth optical beam. The optical device may include an optical isolator positioned in the optical paths of the first optical beam, the second optical beam, the third optical beam, and the fourth optical beam. The one or more lenses and the optical isolator may collectively introduce less than one micron of relative deflection to each of the first optical beam, the second optical beam, the third optical beam, and the fourth optical beam with regard to a set of optical outputs corresponding to the first optical beam, the second optical beam, the third optical beam, and the fourth optical beam.

According to some possible implementations, an optical device may include one or more laser emitters to collectively and independently generate two or more laser beams, each at a different wavelength. The two or more laser beams may be directed to a respective two or more optical outputs via a respective two or more optical paths. The optical device may include optics to direct the two or more laser beams to the respective two or more optical outputs with less than one micron of relative deflection, of each of the two or more laser beams, with respect to the respective two or more optical outputs. The optical device may include one or more lenses in the respective two or more optical paths of the two or more laser beams. The one or more lenses may include an optical isolator in the respective two or more optical paths of the two or more laser beams. The optics may be placed and aligned so that the optics cause a relative deflection, of the two or more laser beams with respect to the respective two or more optical outputs, of less than one micron.

DETAILED DESCRIPTION

The following detailed description of example implementations refers to the accompanying drawings. The same reference numbers in different drawings may identify the same or similar elements.

A laser emitter provides laser light to an optical communications transmitter or an optical communications transceiver at a particular wavelength of light to enable optical communication. Optical communication may occur using multiple wavelengths of light to increase an amount of information that is provided via an optical communications system. Thus, an optical device may require multiple laser emitters to provide laser light at multiple wavelengths of light for an optical communications transmitter or an optical communications transceiver.

A size of optical communications transmitters or transceivers has remained fixed and, in some cases, has decreased over time. However, a quantity of wavelengths of light, at which the optical communications transmitters or transceivers are to provide information, has increased over time. Accordingly, reducing a quantity of optical devices or a size of optical devices that provide multiple laser beams at multiple wavelengths of light from multiple laser emitters is desirable. When optical devices are coupled to, for example, an optical communications transmitter or transceiver, a misalignment between one or more of the multiple laser emitters and the optical communications transmitter or transceiver can result in poor performance. Accordingly, aligning the multiple laser beams with a relatively accurate level of tolerance is desirable.

Implementations, described herein, may provide an optical device including multiple lasers in a compact form factor and with a sub-micron level of tolerance. In this way, the optical device may be utilized with decreasing sizes of optical communications transmitters or transceivers to enable optical communications systems that utilize multiple laser beams with multiple wavelengths of light. In this way, the optical device reduces a cost associated with optical communications systems relative to another optical device with a larger form factor and increases an amount of information that can be provided via the optical communications systems.

Figure 1A:
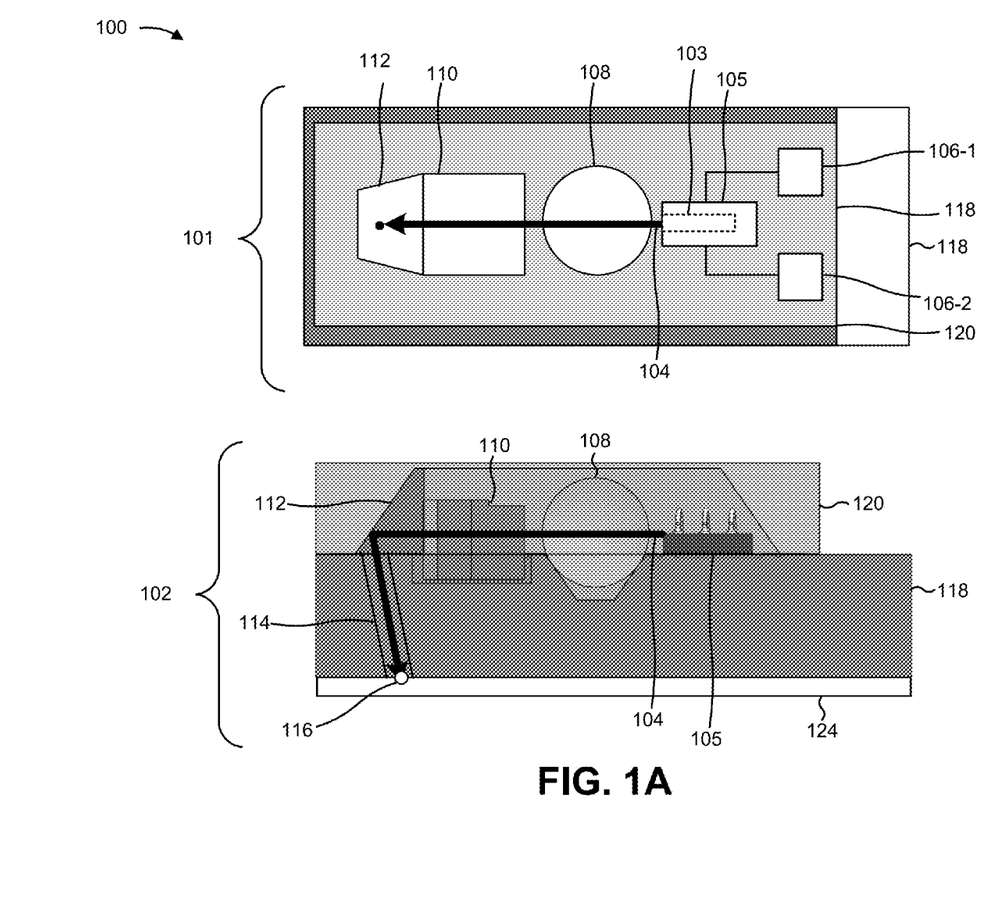
FIGS. 1A and 1B are diagrams of an optical device that outputs a single laser beam.
Figure 1B:
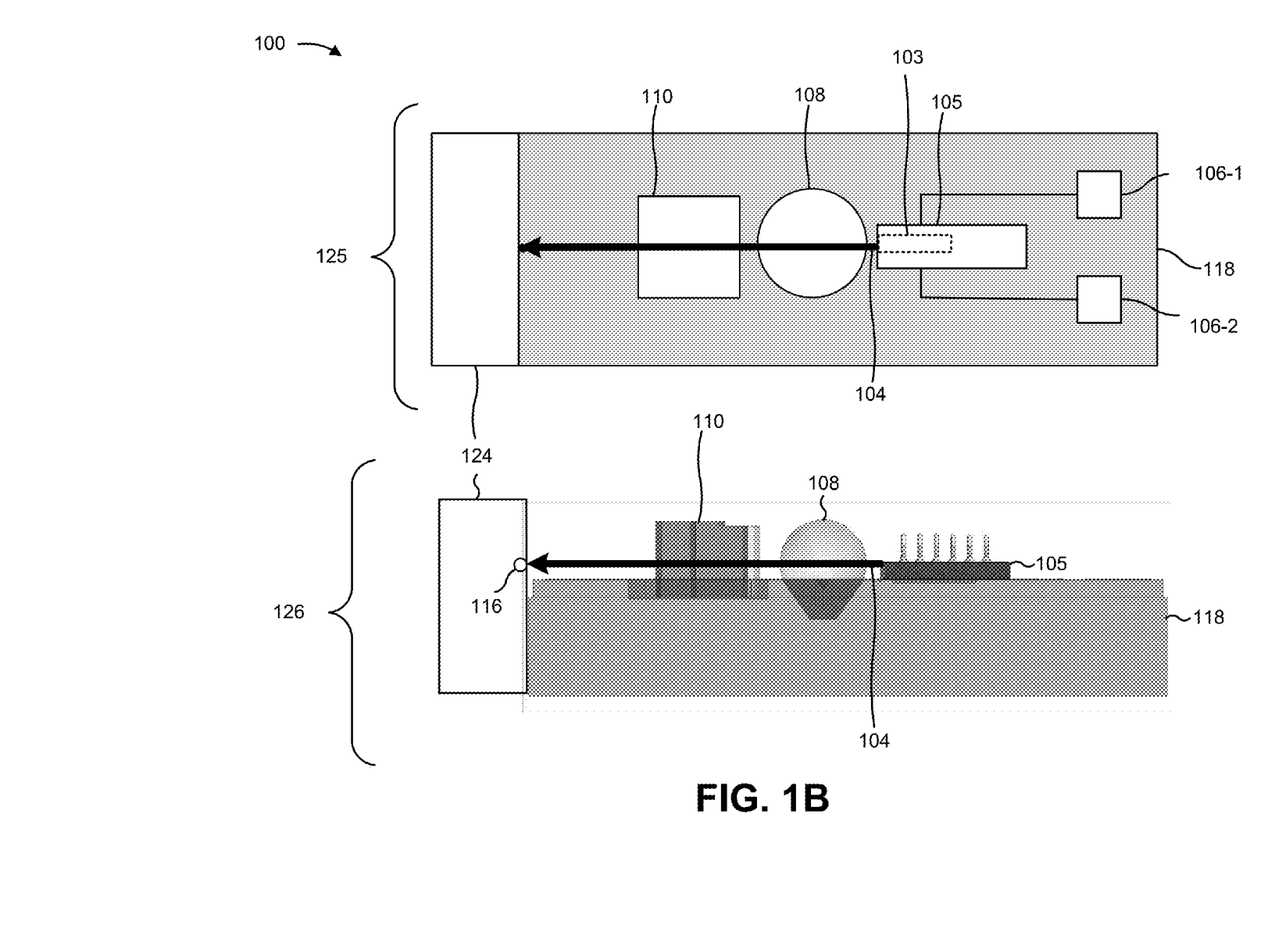

FIGS. 1A and 1B are diagrams of an example implementation of an optical device 100 that outputs a single laser beam. As shown in FIG. 1A, in a cross-sectional top-down view 101 and a cross-sectional side view 102, optical device 100 may include a single laser chip 105, which includes a single laser emitter 103 to generate a laser beam 104, a set of electrical connectors 106-1 and 106-2 (hereinafter referred to individually as "electrical connector 106," and collectively as "electrical connectors 106"), a lens 108, an optical isolator 110, a mirror 112, an optical path 114, an optical output 116, a base 118, and an enclosure 120. Optical device 100 may be optically coupled to optical integrated circuit 124.

Laser chip 105 includes a single laser emitter 103 to generate laser beam 104 based on an electrical power input. For example, laser emitter 103 includes a distributed feedback laser, a solid-state laser, a semiconductor laser diode, a semiconductor laser chip, a semiconductor laser emitter, or the like. Laser emitter 103 may emit light at any wavelength, such as an O-band laser beam (e.g., in a range of 1260 nanometers (nm) to 1360 nm), a C-band laser beam (e.g., in a range of 1528 nm to 1569 nm), or an L-band laser beam (e.g., in a range of 1565 nm to 1625 nm). Laser emitter 103 is powered by and controlled by electrical connectors 106. Electrical connectors 106 include an electrically conductive electrode component that provides electrical current to laser emitter 103 and an electrically conductive ground electrode component that provides a current return path for the laser emitter 103. In some implementations, a controller (not shown) may control laser emitter 103 based on an amperage and/or a voltage provided to laser emitter 103 via electrical connector 106. In some implementations, the laser chip 105, which includes laser emitter 103, is positioned using a pick-and-place technique and mounted using a soldering technique or an epoxying technique.

Lens 108 is a ball lens. In another example, lens 108 may include another type of spherical lens, an aspherical lens, a diffractive lens, a graded-index lens, a cylindrical lens, a collimating lens, or the like. Optical isolator 110 includes a Faraday isolator. In another example, optical isolator 110 may include another type of optical isolator. In another example, optical isolator 110 may be disposed between laser emitter 103 and lens 108. Mirror 112 includes a glass mirror, a metal (e.g. gold) mirror, or the like. In some implementations, mirror 112 may be formed based on applying a wet etching technique to an inside surface of enclosure 120 to form an angled surface and applying a metal deposition technique to the angled surface to provide a reflective angled surface.

Optical path 114 may include an optical path for laser beam 104. In some implementations, base 118 may be optically transparent to laser beam 104, thereby permitting laser beam 104 to propagate along optical path 114 without a waveguide being included in base 118.

Optical output 116 includes an output port of optical device 100. Optical output 116 may be optically coupled to an input optical port of an optical integrated circuit 124. The input optical port can be, for example, a surface grating coupler or any other waveguided coupler.

Base 118 includes a surface or substrate to which components of optical device 100 are affixed. For example, base 118 may include an optical bench whose material is transparent at the laser wavelengths, for example, a silicon substrate, a dielectric substrate, a glass substrate, or the like. Laser beam 104 is directed through base 118 toward optical output 116 and into optical integrated circuit 124. Base 118 is surface coupled to optical integrated circuit 124, as shown. Base 118 may be optically transparent to the laser beam 104. In another example, as shown in FIG. 1B, base 118 is edge coupled to optical integrated circuit 124.

Enclosure 120 encloses optical device 100. For example, enclosure 120 includes a silicon enclosure, a plastic enclosure, a metal enclosure, an epoxy enclosure, or the like. In some implementations, enclosure 120 may include a hermetic enclosure, thereby reducing a variation in an operating environment of optical device 100, such as a humidity variation, a temperature variation, an atmospheric variation, or the like, relative to a non-hermetic operating environment. In some implementations, the enclosure 120 is selected from materials that have a similar coefficient of thermal expansion as base 118. In some implementations, such as when optical device 100 is to be utilized in an environmentally stable environment, optical device 100 may omit enclosure 120.

Optical integrated circuit 124 includes an optical integrated circuit that may be optically coupled to optical device 100 to receive laser beam 104. In some implementations, optical device 100 may be coupled to another type of component, such as a wavelength division multiplexed (WDM) device, a spatial division multiplexed device, a photonic integrated circuit, a silicon integrated photonics circuit, or another type of device that may receive laser beam 104. The optical integrated circuit may include a subset or all of the transceiver functionality. The optical integrated circuit can be assembled within various transceiver form factors including, for example, a small form-factor pluggable (SFP) transceiver, a quad SFP (QSFP) transceiver, or the like. The optical integrated circuit can also be assembled within a module assembly that is mounted directly on a host printed-circuit board assembly (PCBA), or the like.

As shown in FIG. 1B, in a cross-sectional top-down view 125 and a cross-sectional side view 126, a similar optical device 100 is edge coupled to a similar optical integrated circuit 124. In this case, optical device 100 omits mirror 112 and directs laser beam 104 to an optical output port 116 without laser beam 104 passing through base 118. Laser beam 104 may still pass through an enclosure 120 or via an optical path 114 through an enclosure 120.

As indicated above, FIGS. 1A and 1B are provided merely as an example. Other examples are possible and may differ from what was described with regard to FIGS. 1A and 1B.

Figure 2A:
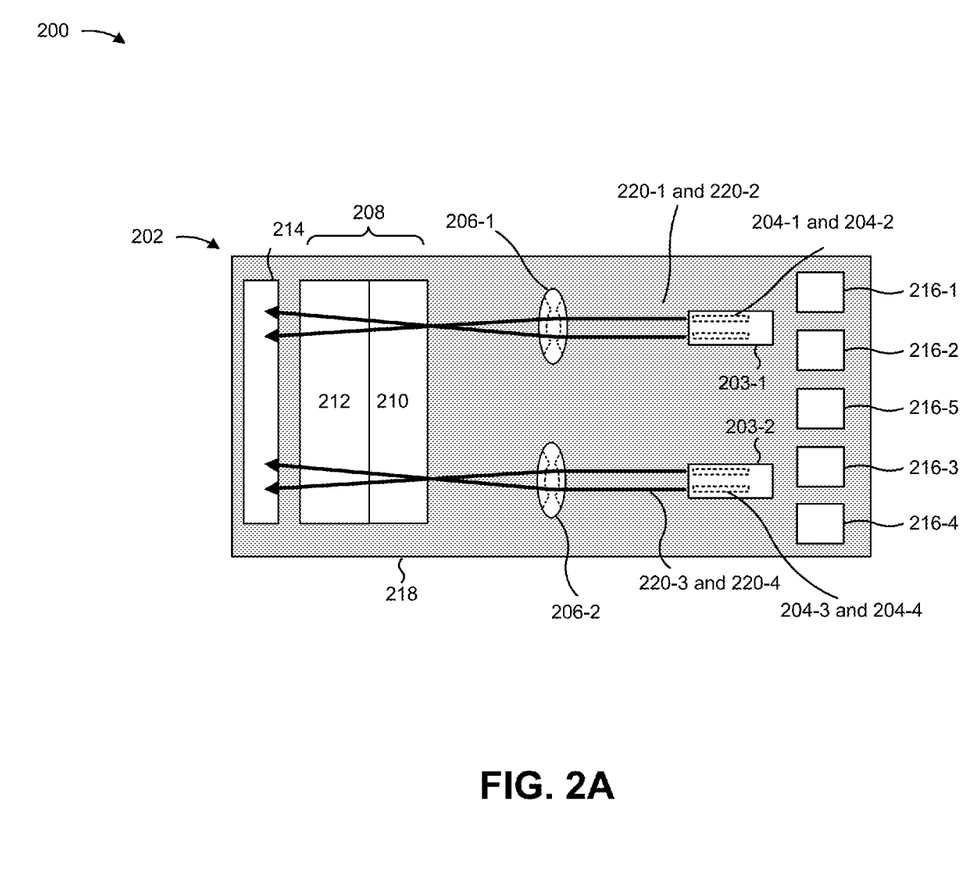
FIGS. 2A and 2B are diagrams of an example implementation of an optical device that outputs multiple laser beams.
Figure 2B:
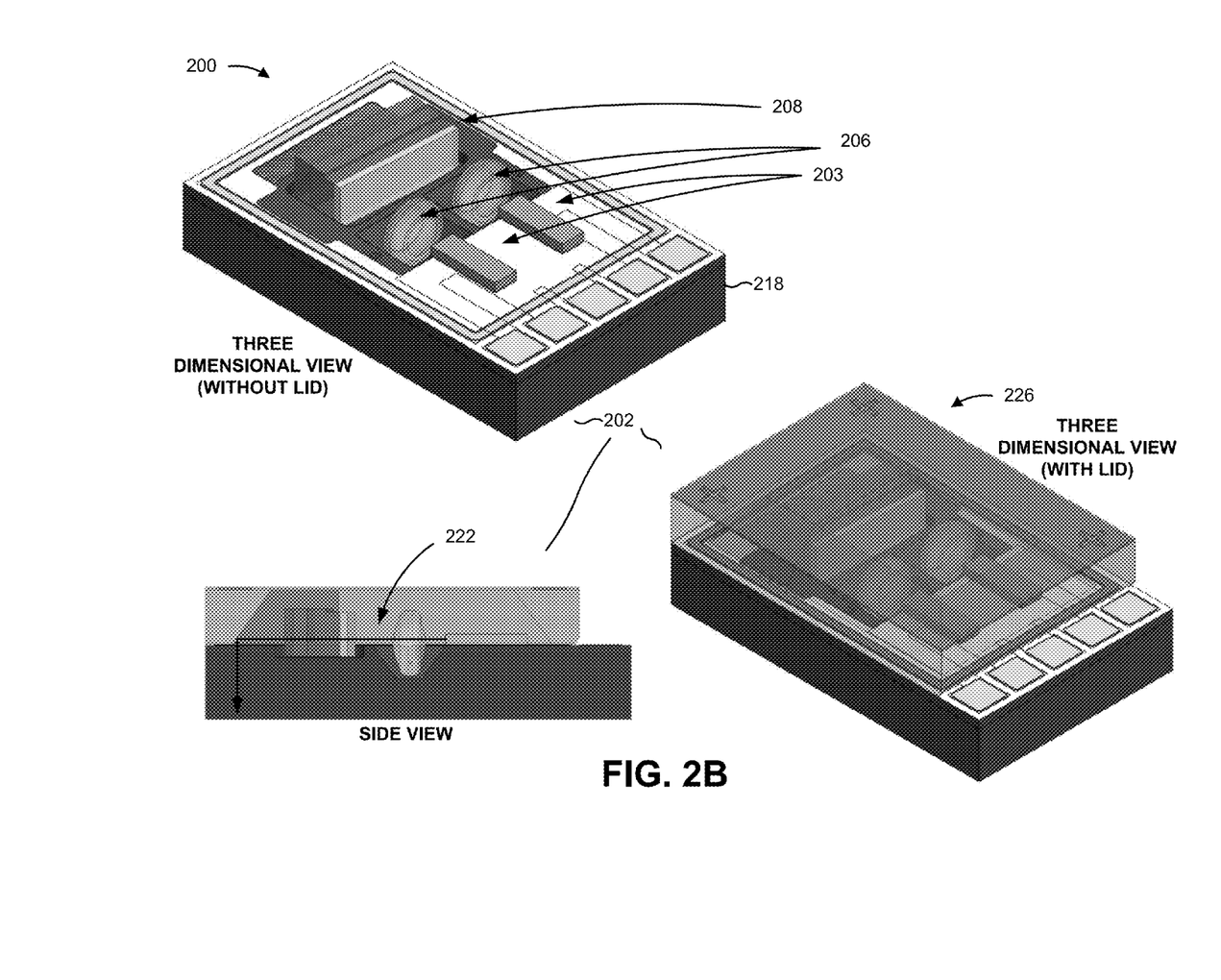

FIGS. 2A and 2B are diagrams of an example implementation 200. FIGS. 2A and 2B show an example of an optical device that outputs multiple laser beams from multiple laser emitters.

As shown in FIG. 2A, an optical device 202 includes a set of two laser chips 203, each including a set of two laser emitters 204 (e.g., a laser chip 203-1 including a first emitter 204-1 and a second laser emitter 204-2 and a laser chip 203-2 including a third laser emitter 204-3 and a fourth laser emitter 204-4), a set of lenses 206 (e.g., a first lens 206-1 and a second lens 206-2), a set of optics 208 (e.g., an optical isolator 210 and a mirror 212), an anti-reflective layer 214, a set of electrical connectors 216-1 through 216-5, and a base 218.

In some implementations, optical device 202 or another multi-laser optical device, described herein, may have a length of approximately 3.7 millimeters or in a range of approximately 2 millimeters to approximately 5 millimeters. In some implementations, optical device 202 or another multi-laser optical device, described herein, may have a width of approximately 2.5 millimeters or in a range of approximately 1 millimeter to approximately 5 millimeters.

Each laser chip 203 includes two laser emitters 204, which each emits a laser beam 220. In other words, collectively, the two laser chips 203-1 and 203-2 include four laser emitters 204-1 through 204-4 that emit four laser beams 220-1 through 220-4 at different wavelengths. For example, each laser chip 203 may include a set of semiconductor laser diodes sharing a common substrate (e.g., two indium-phosphide lasers, two gallium-arsenide lasers, two aluminum-gallium-arsenide lasers, two gallium-phosphide lasers, or two of another, similar type of laser). Each laser beam 220 provided from a laser emitter 204 may eventually be associated with a different channel (e.g., a coarse wavelength division multiplexed (CWDM) channel). For example, laser chip 203-1 includes laser emitter 204-1, which is associated with outputting a first laser beam at a first CWDM channel, and laser emitter 204-2, which is associated with outputting a second laser beam at a second CWDM channel.

In some implementations, laser emitters 204 are associated with a particular pitch. A pitch may refer to physical separation between centers of adjacent laser emitters 204. As illustrated, the pitch laterally separates the laser emitters 204. For example, a first laser emitter 204-1 and a second laser emitter 204-2 of the laser chip 203-1 output laser beams 220-1 and 220-2, respectively, with a pitch of 30 µm (micrometers). In some implementations, the pitch between laser emitters in a laser chip may be 10 µm to 100 µm. In some implementations, the laser chip 203-1 may be separated from the laser chip 203-2 by a distance in a range of approximately 100 µm to approximately 2000 µm. In some implementations, laser emitters 204 correspond to laser emitter 103 shown in FIGS. 1A and 1B.

Lenses 206 each includes a set of two aspheric lenses optically aligned with laser emitters 204. An aspheric lens 206 improves a coupling efficiency for optical device 202. Each lens 206 directs multiple laser beams (e.g., two laser beams with different center wavelengths) emitted by a laser chip 203. For example, when optical device 202 is operating, lens 206-1 receives laser beams 220-1 and 220-2 from laser emitters 204-1 and 204-2 both of laser chip 203-1, and directs laser beams 220-1 and 220-2 toward optics 208. Similarly, lens 206-2 receives laser beams 220-3 and 220-4 from laser emitters 204-3 and 204-4 both of laser chip 203-2, and directs laser beams 220-3 and 220-4 toward optics 208. Based on optical device 202 using two lenses 206 to direct four laser beams 220 toward optics 208, a cost of optical device 202 and a size of optical device 202 is reduced relative to requiring four single beam optical devices 100 (e.g. a single chip having a single emitter) or two dual-laser beam optical devices (e.g. an optical device with two chips each having a single emitter). In some implementations, lens 206 corresponds to lens 108 shown in FIGS. 1A and 1B.

Optics 208 includes an optical isolator 210 and a mirror 212 that are optically aligned with lenses 206. In this case, optical device 202 includes a single optical isolator 210 to receive a set of four laser beams 220 from laser emitters 204 (e.g., via lenses 206), and direct the set of four laser beams 220 toward a single mirror 212 via a set of respective optical paths. Based on using a single optical isolator 210, the four laser beams 220 are maintained in a relative alignment based on being identically deflected (e.g., each relative deflection of each of the four laser beams 220 is substantially similar and satisfies a threshold similarity with each other deflection) as a result of fabrication tolerances associated with the single optical isolator 210, material differences, misalignment, or the like. In other words, although an absolute deflection greater than one micron may be introduced for each of the four laser beams 220 by regions of optical isolator 210, a relative deflection of each of the four laser beams 220 relative to each other laser beam 220 and an optical output of less than one micron (e.g., a sub-micron level of tolerance) is achieved, thereby allowing for optical device 202 to be aligned, with all four output beams being accurately aligned to the 4 grating couplers, in the same alignment step.

In some implementations, the tolerance may be with respect to a lateral direction from respective optical outputs. For example, using a single optical isolator 210 results in multiple laser beams 220 remaining within a threshold lateral distance in a lateral plane. Similarly, the tolerance may be with respect to an angular direction. For example, using the single optical isolator 210 results in multiple laser beams 220 maintaining a relative angular direction. Similarly, the tolerance may be with respect to a focal deviation. For example, using the single optical isolator 210 results in multiple laser beams 220 being subject to similar focal deviation. Based on maintaining the tolerance for the multiple laser beams 220 (e.g., a tolerance with regard to a relative lateral displacement, a relative angular displacement, or a relative focal deviation), optical device 202 can couple multiple optical outputs of optical device 202 to multiple optical inputs of another device, such as an optical integrated circuit.

In some implementations, the tolerance may be an absolute tolerance related to an absolute deflection of any of the optical beams from a reference output position. For example, components of optical device 202 may be positioned and configured such that each of the multiple laser beams 220 maintains a threshold absolute tolerance relative to an ideal output position (e.g., the reference output position) toward a target for each of the multiple laser beams 220. In other words, a particular laser beam 220 is not caused to deviate from an ideal output position by more than a threshold amount in a lateral direction, an angular direction, or with respect to a focal deviation.

In contrast, utilizing multiple optical isolators could result in different fabrication tolerances associated with the multiple optical isolators (e.g., a parallelism error associated with surfaces of the multiple optical isolators) introducing different amounts of deflection to each of the four laser beams 220 preventing all output beams from being simultaneously aligned to the input ports of the optical integrated circuit. In some implementations, optical isolator 210 and mirror 212 correspond, respectively, to optical isolator 110 and mirror 112 shown in FIGS. 1A and 1B.

Anti-reflective layer 214 includes layers that reduce a back-reflectance of laser beams 220 when laser beams 220 are directed into an optical waveguide and toward a set of input optical gratings of an optical integrated circuit (not shown). Anti-reflective coatings could also be applied to other surfaces in the optical device such as to lenses 206 and facets of laser emitters.

Electrical connectors 216 include a set of electrodes, each corresponding to a laser of laser emitters 204, and a ground electrode common to each of the lasers of laser emitters 204. For example, electrical connector 216-1 corresponds to a first laser of laser emitter 204-1, a second electrical connector 216-2 corresponds to a second laser of laser emitter 204-1, a third electrical connector 216-3 corresponds to a first laser of laser emitter 204-2, and a fourth electrical connector 216-4 corresponds to a second laser of laser emitter 204-2. In this case, electrical connectors 216-1 through 216-4 are associated with controlling laser emitters 204. Additionally, each of the lasers of laser emitters 204-1 and 204-2 share a fifth electrical connector 216-5 (e.g., a ground electrode) that is an electrical ground for the lasers. In some implementations, electrical connectors 216 correspond to electrical connectors 106, shown in FIGS. 1A and 1B.

FIG. 2B shows optical device 202 in a first three-dimensional view where optical device 202 does not include a lid, in a second three-dimensional view where optical device 202 includes a lid, and in a side-view. In this case, each laser chip 203 is flip-chip mounted to base 218. Based on using a flip-chip bonding arrangement (e.g., a flip-chip mounting technique), optical device 202 reduces a likelihood of a relative misalignment (e.g. lateral, angular, focal misalignment) of laser chip 203-1 and laser chip 203-2 relative to a non-flip-chip mounting technique. For example, when a non-flip chip mounting technique is used, each laser chip 203 includes a polished side which is mounted to base 218. In this case, a variability in a thickness of a first polished side of laser chip 203-1 and a second polished side of laser chip 203-2 may be on the order of a few microns or more, making it much more difficult to satisfy a sub-micron level of tolerance that is to be utilized to optically couple optical device 202 to an optical integrated circuit. In contrast, using the flip-chip mounting technique, optical device 202 may satisfy the sub-micron level of tolerance, which enables laser beams 220 to be directed from each laser emitter 204 of each laser chip 203 to the optical integrated circuit without degraded performance. This is possible because the thickness of the chip from the emitter to the top surface (the surface bonded to the base 218 when flip-chip bonding is used) is well controlled, with a tolerance being a less than one micron.

As shown by ray-trace 222, when optical device 202 is operating, laser beams 220 are directed from each laser emitter 204 of each laser chip 203 toward an optical integrated circuit (not shown) via lenses 206 and optics 208. As shown by reference number 226, optical device 202 includes lid 226 (e.g., a silicon lid) to protect (e.g., hermetically seal) at least the free space optical components of optical device 202. In some implementations, lid 226 corresponds to enclosure 120 shown in FIG. 1A.

As indicated above, FIGS. 2A and 2B are provided merely as an example. Other examples are possible and may differ from what was described with regard to FIGS. 2A and 2B.

Figure 3A:
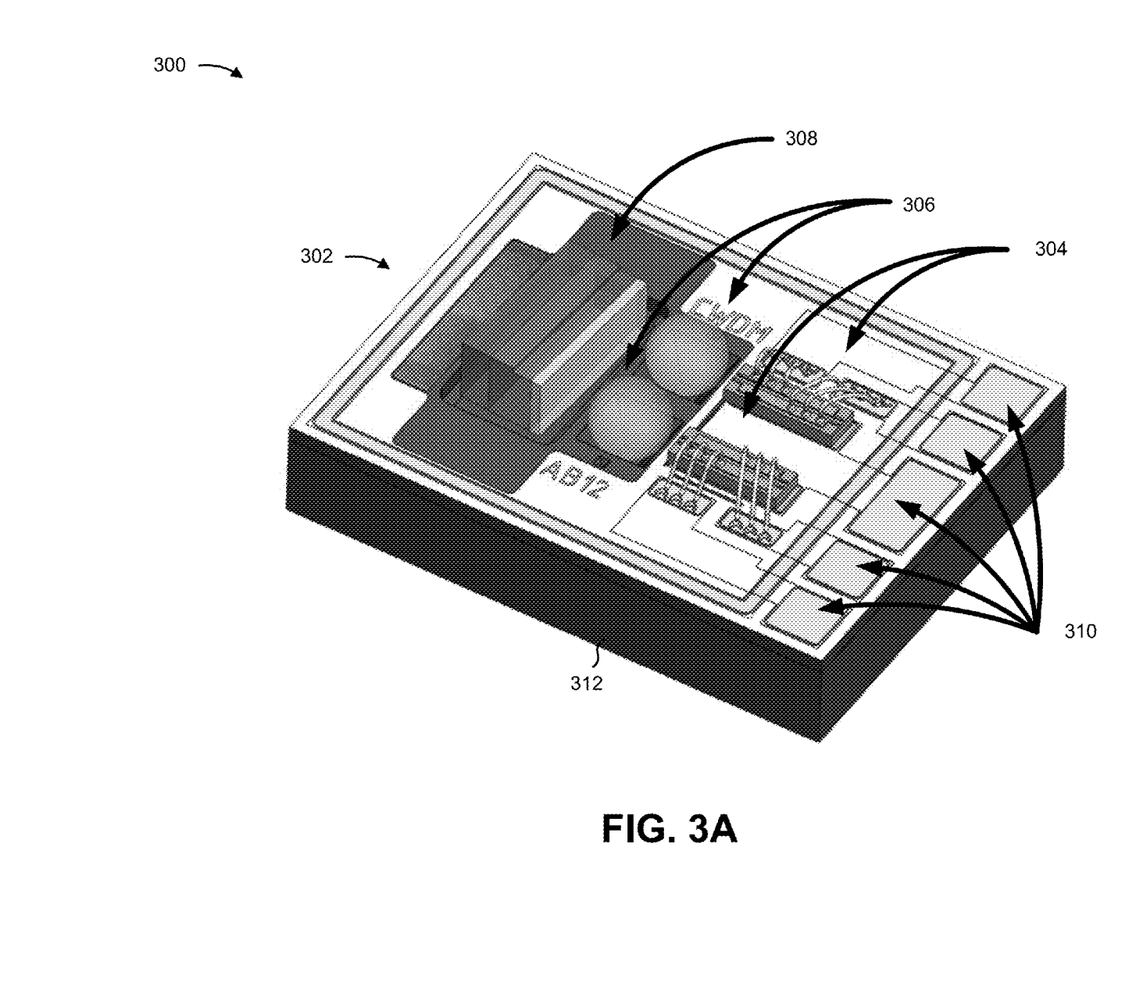
FIGS. 3A and 3B are diagrams of another example implementation of an optical device that outputs multiple laser beams.
Figure 3B:
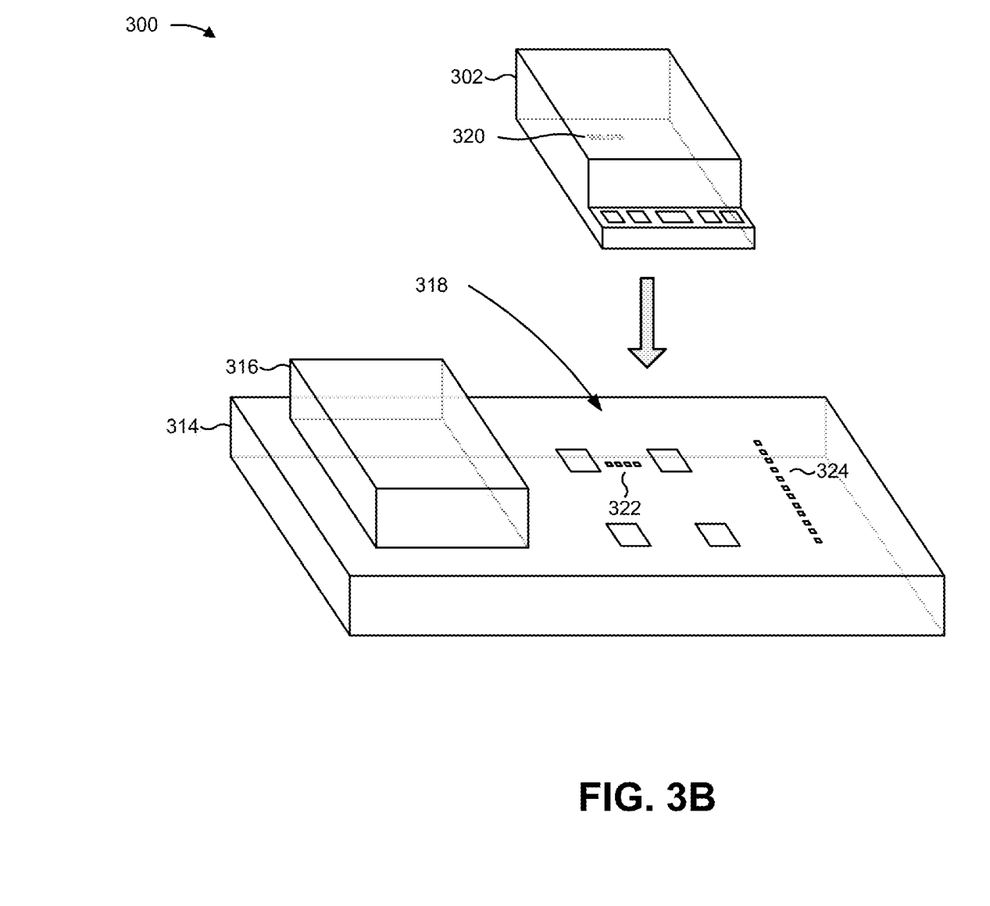

FIGS. 3A and 3B are diagrams of an example implementation 300. FIGS. 3A and 3B show an example of an optical device including multiple laser chips each with multiple laser emitters.

As shown in FIG. 3A, an optical device 302 includes a set of laser chips 304, a set of lenses 306, a set of optics 308, a set of electrical connectors 310, and a base 312. In some implementations, lenses 306, optics 308, electrical connectors 310, and base 312 correspond, respectively, to those shown in FIGS. 1A and 1B or in FIGS. 2A and 2B.

As further shown in FIG. 3A, laser chips 304 include a set of two laser emitters, each laser emitter emitting one laser beam for a total of four laser beams. In other words, optical device 302 includes a first laser chip 304 to emit two laser beams and a second laser chip 304 to emit two laser beams, resulting in an output of four laser beams. In this case, each of the set of laser chips 304 is mounted p-side up (i.e., p-doped active emitting region facing up) relative to a surface of base 312, rather than being flip-chip mounted to the surface of base 312. In some implementations, laser chips 304 are associated with a particular separation. For example, for a set of ball lenses 306, each with a diameter of 500 µm, laser chips 304 are associated with a separation of approximately 700 µm (e.g., with a 200 µm ga between lenses).

As further shown in FIG. 3A, lenses 306 include a set of ball lenses, which are to focus or collimate the four laser beams emitted by the laser emitters of the set of laser chips 304. A ball lens 306 reduces a cost of fabrication for optical device 302 relative to utilizing another type of lens such as another type of spherical lens or a non-spherical lens. In this case, two lenses 306 are utilized for the four laser beams.

As shown in FIG. 3B, optical device 302 is to be mounted to a surface of optical integrated circuit 314, which includes an electronic integrated circuit 316. In this case, as shown by reference number 318, four alignment square fiducials can be utilized to align optical outputs 320 of optical device 302 with input optical grating 322 of optical integrated circuit 314 with a sub-micron level of tolerance. The alignment can be active (e.g., a laser is activated and the strength of the light signal coupled into the optical circuit waveguide is monitored and used to optimize the alignment of the optical device) or it can be passive (e.g., the alignment is realized by using high-resolution cameras to monitor lithographically-defined alignment features and the registration of alignment features located on the device and the optical integrated circuit). Optical integrated circuit 314 may receive four laser beams from four optical outputs 320 of a single optical device 302 via four optical inputs of input optical grating 322 aligned to a sub-micron level of tolerance. As shown by reference number 324, optical integrated circuit 314 may include an array of input and output gratings 324, which may be connected to a single mode fiber array.

In another example, optical device 302 may provide another quantity of laser beams via another quantity of outputs, such as a greater quantity of laser beams, a lesser quantity of laser beams, or the like. In another example, optical device 302 may provide the multiple laser beams via another configuration (e.g., a non-linear configuration), such as a square configuration (e.g., each laser beam of a set of four laser beams forming corners of a square) or another type of configuration.

As indicated above, FIGS. 3A and 3B are provided merely as an example. Other examples are possible and may differ from what was described with regard to FIGS. 3A and 3B.

Figure 4A:
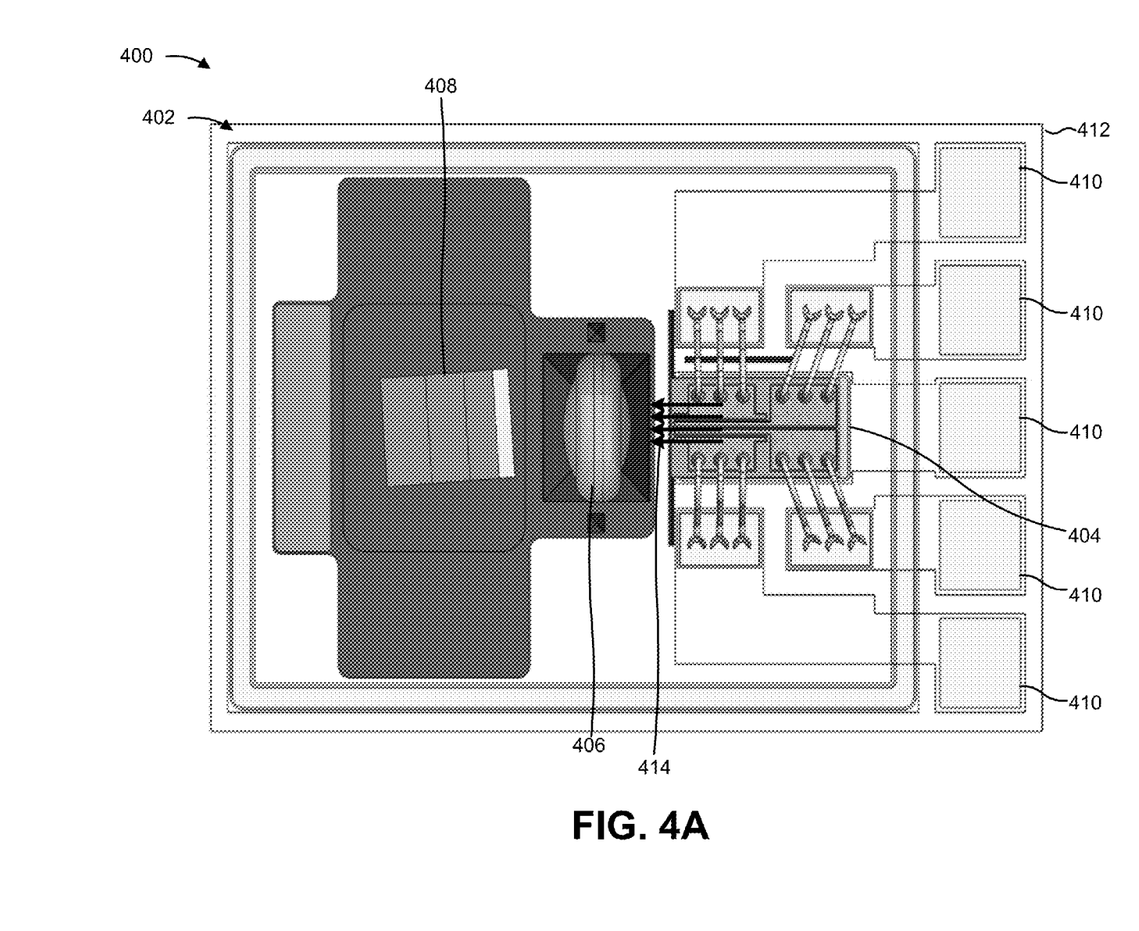
FIGS. 4A and 4B are diagrams of yet another example implementation of an optical device that outputs multiple laser beams.
Figure 4B:
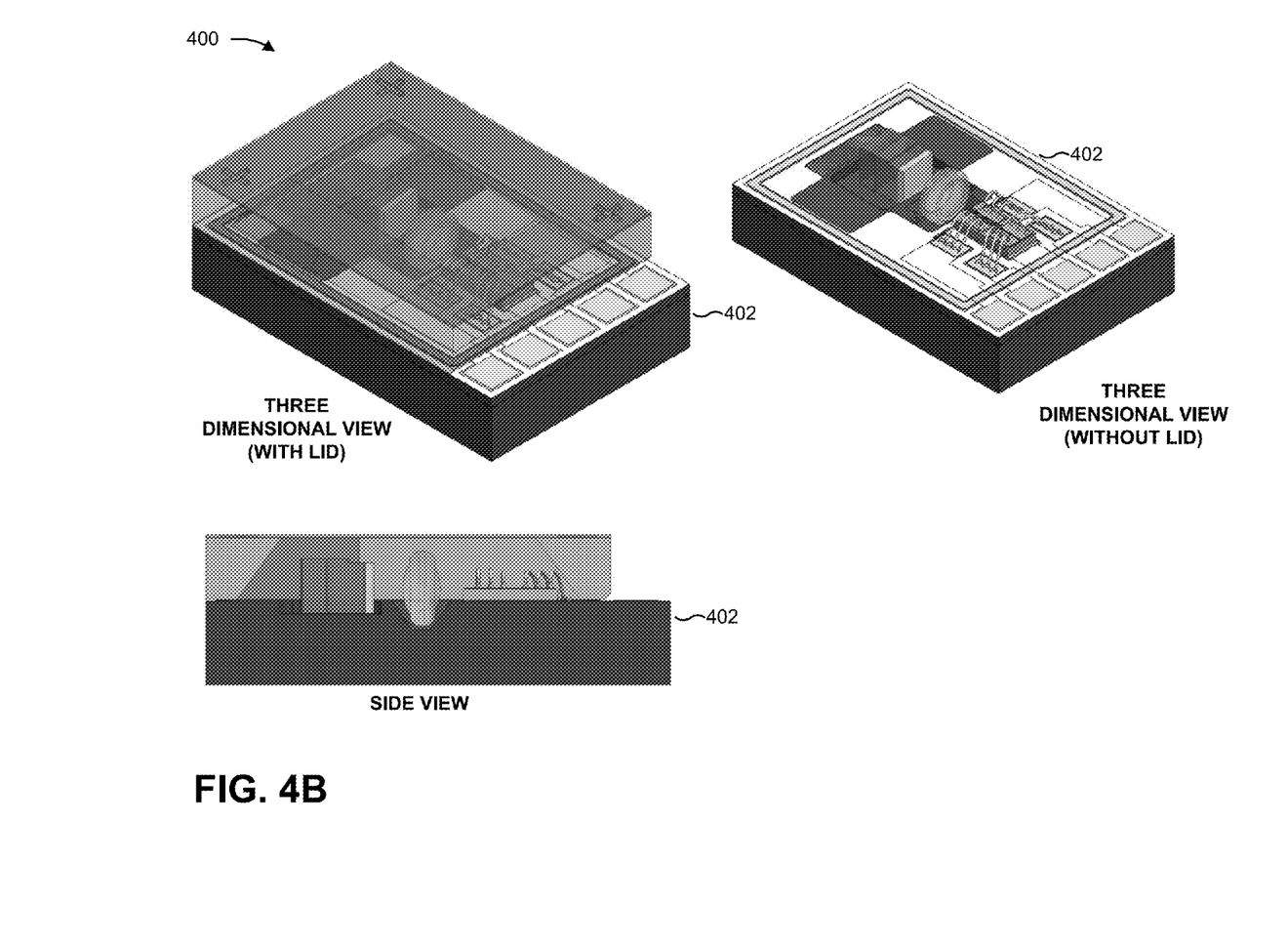

FIGS. 4A and 4B are diagrams of an example implementation 400. FIGS. 4A and 4B show an example of an optical device including a single laser chip having four laser emitters.

As shown in FIG. 4A, an optical device 402 includes a laser chip 404, which includes four laser emitters, a lens 406, a set of optics 408, a set of electrical connectors 410, and a base 412. In some implementations, lens 406, optics 408, electrical connectors 410, and base 412 correspond, respectively, to those shown in FIGS. 3A and 3B.

As further shown in FIG. 4A (e.g., in a top-down view) and in FIG. 4B (e.g., in a first three-dimensional view where optical device 402 includes an enclosure, in a second three-dimensional view where optical device 402 does not include an enclosure, and in a side-view), laser chip 404 includes a single chip that emits four laser beams 414. For example, laser chip 404 includes a set of four distributed feedback (DFB) lasers integrated onto a single chip. In this case, laser chip 404 (e.g., the single chip) is mounted p-side up to base 412. Based on the set of four DFB lasers being integrated onto the single chip (e.g., the four DFB lasers are lithographically defined), the height tolerance of each emitter relative to each other is a small fraction of one micron (i.e., sub-micron tolerance), and as a result, flip-chip mounting is not required. In other words, the relative position of each of the four laser beams is controlled based on the four laser beams being emitted from the same chip.

Each of the four laser beams is directed toward a single lens 406, which directs the four laser beams toward the set of optics 408. Optics 408 includes an optical isolator, which includes four regions to receive the four laser beams. The optical isolator may be fabricated such that each region causes a respective absolute deflection in a respective laser beam satisfying a threshold similarity to each other region to ensure that a relative deflection of each laser beam by the optical isolator is less than a threshold amount to maintain a sub-micron level of alignment of the four laser beams. For example, a first laser beam, of the four laser beams, may be deflected a first amount by a first region of the optical isolator as a result of imperfections in the optical isolator and a second laser beam, of the four laser beams, may be deflected a second amount by a second region of the optical isolator. In this case, the first amount and the second amount may satisfy a threshold similarity to maintain a relative alignment of the first laser beam and the second laser beam. Additionally, or alternatively, the first amount and the second amount may each satisfy a threshold associated with ensuring a sub-micron level of tolerance.

In this case, based on using a single chip for laser chip 404 and using a single lens 406, optical device 402 is associated with a reduced size relative to another configuration, such as multiple optical devices 100, with multiple chips or multiple lenses. Moreover, although a lens, such as lens 406, may include imperfections and flaws that affect laser beams 414, based on using a single lens 406, each laser beam 414 should be deflected by lens 406 the same amount relative to each other laser beam 414. In other words, any relative deflection among laser beams 414 is minimized. In this way, optical device 402 is associated with a reduced likelihood of misalignment relative to another optical device with multiple lenses or multiple sets of optics corresponding to multiple laser beams or relative to multiple optical devices providing multiple laser beams.

Components of optical device 402 may be selected, fabricated, and/or aligned to achieve such a relative tolerance or such an absolute tolerance, based on characteristics such as optical magnification, optical aberration, or the like. For example, for a grating coupling to the optical output with a grating center-to-center separation (i.e., a pitch) of 120 μm for four laser beams 414, laser emitters 404, lenses 406, and optics 408 may be selected such that laser beams 414 are provided with a pitch of within a sub-micron tolerance of 30 μm. In this case, utilizing a single lens 406, a single optical isolator of optics 408, or the like reduces a likelihood that a relative deflection is introduced into laser beams 414 that may cause one or more of the laser beams 414 to fail to be directed to a target associated with the grating locations.

In another example, for which greater than four lasers are desired (e.g., 8 lasers, 10 lasers, 12 lasers, or the like), multiple chips each emitting multiple laser beams (e.g., with different center wavelengths) may be integrated into a single optical device or a chip including a greater quantity of laser emitters may be selected.

As indicated above, FIGS. 4A and 4B are provided merely as an example. Other examples are possible and may differ from what was described with regard to FIGS. 4A and 4B.

Based on utilizing a single optical device to provide multiple laser beams from one or more laser emitters, such as optical device 202, optical device 302, optical device 402, or the like, an optical integrated circuit can be provided with reduced cost and/or size relative to utilizing multiple optical devices to provide the multiple laser beams, such as multiple optical devices 100. Similarly, based on utilizing the single optical device, a sub-micron level of tolerance for an alignment of multiple laser beams to a set of optical outputs of the optical device may be achieved with reduced difficulty relative to utilizing the multiple optical devices.

The foregoing disclosure provides illustration and description, but is not intended to be exhaustive or to limit the implementations to the precise form disclosed. Modifications and variations are possible in light of the above disclosure or may be acquired from practice of the implementations.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items, and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. An optical device, comprising:
   a semiconductor laser chip to independently generate four laser beams at different wavelengths,
      each laser beam, of the four laser beams, to be directed to a respective optical output of the optical device with a sub-micron level of tolerance of each laser beam relative to the respective optical outputs of the optical device, and
      each laser beam, of the four laser beams, being associated with a different optical path from the semiconductor laser chip to the respective optical output of the optical device;
   a lens to receive each of the four laser beams,
      the lens being positioned to direct each laser beam, of the four laser beams, toward the respective optical output of the optical device; and
   an optical isolator to receive each of the four laser beams.

2. The optical device of claim 1, further comprising:
   a mirror to direct the four laser beams toward the respective optical outputs of the optical device.

3. The optical device of claim 1, where the optical isolator is aligned so that regions of the optical isolator, that are in the different optical paths, have respective deflections satisfying a threshold similarity, to reduce relative deflection of the four laser beams with respect to the respective optical outputs of the optical device.

4. The optical device of claim 3, where the respective deflections of the regions relate to one or more of:
   differences in material properties of the regions, or
   misalignment of at least one of the lens or the optical isolator.

5. The optical device of claim 1, where the lens is aligned so that regions of the lens, that are in the different optical paths, have respective deflections satisfying a threshold similarity.

6. The optical device of claim 1, where the optical device is coupled to an optical integrated circuit,
   the respective optical outputs of the optical device being aligned to a set of input optical gratings of the optical integrated circuit with the sub-micron level of tolerance.

7. The optical device of claim 1, where the sub-micron level of tolerance is a tolerance with regard to one or more of:
   a lateral direction from the respective optical outputs of the optical device,
   an angular direction from a normal to the respective optical outputs of the optical device, or
   a focal deviation with regard to the respective optical outputs of the optical device.

8. An optical device, comprising:
   a first laser chip and a second laser chip,
      the first laser chip including a first laser emitter to generate a first optical beam and a second laser emitter to generate a second optical beam, and
      the second laser chip including a third laser emitter to generate a third optical beam and a fourth laser emitter to generate a fourth optical beam,
      each optical beam, of the first optical beam, the second optical beam, the third optical beam, and the fourth optical beam, to have a different center wavelength;
   one or more lenses positioned in optical paths of the first optical beam, the second optical beam, the third optical beam, and the fourth optical beam; and
   an optical isolator positioned in the optical paths of the first optical beam, the second optical beam, the third optical beam, and the fourth optical beam,
      the one or more lenses and the optical isolator to collectively introduce less than one micron of relative deflection to each of the first optical beam, the second optical beam, the third optical beam, and the fourth optical beam with regard to a set of optical outputs corresponding to the first optical beam, the second optical beam, the third optical beam, and the fourth optical beam.

9. The optical device of claim 8, where the first laser chip and the second laser chip are mounted to a substrate of the optical device based on a flip-chip bonding arrangement.

10. The optical device of claim 8, where the one or more lenses comprise at least one of:
   an aspherical lens,
   a spherical lens, or
   a cylindrical lens.

11. The optical device of claim 8, where the one or more lenses comprise:
   a first lens in the optical paths of the first optical beam and the second optical beam; and
   a second lens in the optical paths of the third optical beam and the fourth optical beam.

12. The optical device of claim 11, where the first lens is positioned and configured, relative to the second lens, to cause a relative deflection, of the first optical beam relative to the third optical beam or the fourth optical beam, to be less than one micron; and
   where the first lens is positioned and configured, relative to the second lens, to cause a relative deflection, of the second optical beam relative to the third optical beam or the fourth optical beam, to be less than one micron.

13. The optical device of claim 8, where the one or more lenses and the optical isolator are positioned and configured to cause a deflection of each of the first optical beam, the second optical beam, the third optical beam, and the fourth optical beam of less than one micron from a reference position.

14. The optical device of claim 13, where the reference position is associated with a set of optical outputs for each of the first optical beam, the second optical beam, the third optical beam, and the fourth optical beam.

15. An optical device, comprising:
   one or more laser emitters to collectively and independently generate two or more laser beams, each at a different wavelength,
      the two or more laser beams to be directed to a respective two or more optical outputs via a respective two or more optical paths; and
   optics to direct the two or more laser beams to the respective two or more optical outputs with less than one micron of relative deflection, of each of the two or more laser beams, with respect to the respective two or more optical outputs,
      the optics comprising:
         one or more lenses in the respective two or more optical paths of the two or more laser beams, and
         an optical isolator in the respective two or more optical paths of the two or more laser beams,
            the optics to be placed and aligned so that the optics cause a relative deflection, of the two or more laser beams with respect to the respective two or more optical outputs, of less than one micron.

16. The optical device of claim 15, where the optics are further to direct the two or more laser beams to the respective two or more optical outputs with less than one micron of absolute deflection.

17. The optical device of claim 15, where the one or more lenses comprise:
   a first lens in an optical path of at least one laser beam of the two or more laser beams; and
   a second lens in an optical path of each laser beam, of the two or more laser beams, other than the at least one laser beam in the optical path of the first lens.

18. The optical device of claim 15, where the one or more laser emitters comprise one or more semiconductor laser chips.

19. The optical device of claim 15, one or more laser chips including the one or more laser emitters,
   the one or more laser chips being affixed to the optical device based on a flip-chip bonding arrangement.

20. The optical device of claim 19, where a first laser chip, of the one or more laser chips, includes first laser emitters, of the one or more laser emitters, to generate a first pair of laser beams of the two or more laser beams; and
   where a second laser chip, of the one or more laser chips, includes second laser emitters, of the one or more laser emitters, to generate a second pair of laser beams of the two or more laser beams.

* * * * *